United States Patent
Lombardi et al.

(10) Patent No.: US 8,648,708 B2
(45) Date of Patent: Feb. 11, 2014

(54) METHOD AND APPARATUS FOR REDEFINING ELECTRICAL POWER SYSTEM WIRING

(75) Inventors: Steven Lombardi, Whitewater, WI (US); Mark E. Delker, Sheboygan Falls, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 430 days.

(21) Appl. No.: 12/959,620

(22) Filed: Dec. 3, 2010

(65) Prior Publication Data
US 2012/0139361 A1    Jun. 7, 2012

(51) Int. Cl.
*G08B 29/00*    (2006.01)

(52) U.S. Cl.
USPC ........................................ 340/515; 340/425.5

(58) Field of Classification Search
USPC ........ 340/515, 425.5, 650; 709/220; 324/522, 324/765, 715
See application file for complete search history.

(56) References Cited

U.S. PATENT DOCUMENTS

| | | | | |
|---|---|---|---|---|
| 7,425,778 B2* | 9/2008 | Labuschagne et al. | ......... | 307/14 |
| 7,743,118 B1* | 6/2010 | Kar et al. | ...................... | 709/220 |
| 2002/0004915 A1* | 1/2002 | Fung | .............................. | 713/320 |
| 2006/0202674 A1* | 9/2006 | Long | ............................ | 324/142 |

OTHER PUBLICATIONS

Rockwell Automation, "Powermonitor 1000 Unit", pp. 1-84, May 2008.
Elspec Ltd, "G4400 Series Blackbox User Guide", pp. 88-90, Oct. 2009.
Schneider Electric, "PowerLogic Circuit Monitor Series 4000 Reference Manual", pp. 55-59, Dec. 2005.

* cited by examiner

*Primary Examiner* — Shirley Lu
(74) *Attorney, Agent, or Firm* — Quarles & Brady LLP; William Walbrun; John M Miller

(57) ABSTRACT

Methods and apparatus detect wiring error(s), identify to the user what wiring error has been detected, and redefine the wiring configuration. An indication is provided to the user that the apparatus has redefined the wiring configuration. Steps may be automated and/or initiated by the user.

13 Claims, 4 Drawing Sheets

__US 8,648,708 B2__

METHOD AND APPARATUS FOR REDEFINING ELECTRICAL POWER SYSTEM WIRING

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The subject matter disclosed herein relates generally to correcting wiring errors in electrical power system wiring, and, more particularly, to methods and apparatus for redefining electrical power system wiring configurations within an industrial automation application.

In a typical industrial automation electrical power distribution system, electrical power is provided to various loads. Such loads may include, for example, various motors and drives used by the end consumer to control an industrial automation application. Because energy management and understanding energy costs are a major focus in the manufacturing industry, devices commonly referred to as power meters or power monitors are commonly installed in the electrical power system. The power monitor is used for cost effective energy monitoring of industrial automation applications where load profiling, cost allocation, or other energy related control or monitoring may be beneficial.

Likely the most common problem that occurs when a power monitor is installed (electrically wired) within an electrical power system is that the input wiring connecting the electrical power system to the power monitor is incorrect, for a variety of reasons. For example, it is fairly common for the wiring of one or more current transformers or potential transformers (when present) to be 180 degrees out of phase, for the phase sequence to be incorrect, or for incorrect correlation of the voltage and current phases. These and other wiring errors result in incorrect metering data and can sometimes be difficult to identify. In addition, the wiring error may not be discovered at the time of installation. In many situations, the wiring corrections can not be made until the power can be shut down for safety and/or continuous process reasons. This may mean the wiring error can not be corrected for several weeks or months.

Prior devices have attempted to address this problem. There are some power monitoring devices that are able to provide a phasor diagram as a way to help the user identify possible wiring problems. Nevertheless, interpreting a phasor diagram requires someone with sufficient knowledge of phasor vectors and how to translate the phasor diagram to a possible wiring error. There are also some power monitoring devices that need to be told of the problem, such as that the wiring (current inputs) from a current transformer are inverted. After the user tells the monitoring device of the problem, the inverted current transformer wiring can be corrected by firmware in the monitoring device without needing to rearrange (rewire) the current inputs. Nevertheless, these prior devices require user analysis and user input in order to detect a wiring error and/or to correct the wiring error so that the power monitor can provide accurate metering data.

It would, therefore, be desirable to have methods and apparatus to automatically detect wiring error(s), identify to the user what wiring error has been detected, and redefine the wiring configuration, so that the power monitor can provide accurate metering data. The methods and apparatus desirably provide an indication to the user that the power monitor has redefined the electrical power system wiring.

BRIEF DESCRIPTION OF THE INVENTION

The present embodiments overcomes the aforementioned problems with detecting and correcting wiring errors in electrical power systems by providing methods and apparatus for automatically detecting, identifying and redefining electrical power system wiring connections within an industrial automation application. The methods and apparatus include a power monitor having a virtual wiring correction assembly. An indication is provided for the user when a virtual wiring correction has been enabled to alert the user to the fact that the power monitor has redefined one or more of the voltage or current input wiring connections.

In accordance with one aspect of the invention, an energy measurement, control and management system for monitoring and redefining an electric power system wiring configuration within an industrial automation application is provided. The energy measurement, control and management system comprises an input wiring assembly including input wiring connections adapted to be electrically coupled to the electrical power system wiring, the input wiring assembly adapted to receive input wiring data from the electrical power system wiring coupled to the input wiring connections, and the input wiring data associated with the electrical power system wiring configuration within the industrial automation application. A virtual wiring correction assembly is in communication with the input wiring assembly, the virtual wiring correction assembly adapted to receive the input wiring data and determine if the electrical power system wiring configuration matches a preconfigured electrical power system wiring configuration. An indicator is included and is adapted to provide an indication that, when the virtual wiring correction assembly determines that the electrical power system wiring configuration does not match the preconfigured electrical power system wiring configuration, the virtual wiring correction assembly has redefined one or more of the input wiring connections so the electrical power system wiring configuration matches the preconfigured electrical power system wiring configuration.

In accordance with another aspect of the invention, a system for monitoring and redefining an electric power system wiring configuration is provided. The system comprises an input wiring assembly including voltage input wiring connections and current input wiring connections adapted to be electrically coupled to the electrical power system wiring, the input wiring assembly adapted to receive voltage input wiring data and current input wiring data from the electrical power system wiring. A virtual wiring correction assembly is in communication with the input wiring assembly, the virtual wiring correction assembly adapted to receive the voltage input wiring data and the current input wiring data and diagnose if the electrical power system wiring configuration matches a preconfigured electrical power system wiring configuration. An indicator is included and is adapted to provide an indication that, when the virtual wiring correction assembly determines that the electrical power system wiring configuration does not match the preconfigured electrical power system wiring configuration, the virtual wiring correction assembly has redefined in firmware one or more of the voltage input wiring connections and current input wiring connections so the electrical power system wiring configuration matches the preconfigured electrical power system wiring configuration.

In accordance with yet another aspect of the invention, a method for redefining an electric power system wiring configuration is provided. The method comprises the steps of a) inputting wiring mode data into a virtual wiring correction assembly; b) performing a wiring diagnostic on the electrical power wiring configuration; c) providing a wiring status based on the wiring diagnostic, the wiring status indicating a wiring error or no wiring error; d) when a wiring error is indicated, performing a virtual wiring correction to redefine the wiring error; and e) activating an indicator to alert a user that the electrical power system wiring has been redefined.

To the accomplishment of the foregoing and related ends, the embodiments, then, comprise the features hereinafter fully described. The following description and the annexed drawings set forth in detail certain illustrative aspects of the invention. However, these aspects are indicative of but a few of the various ways in which the principles of the invention can be employed. Other aspects, advantages and novel features of the invention will become apparent from the following detailed description of the invention when considered in conjunction with the drawings.

BRIEF DESCRIPTION OF THE DRAWINGS

The embodiments will hereafter be described with reference to the accompanying drawings, wherein like reference numerals denote like elements, and.

DETAILED DESCRIPTION OF THE INVENTION

The various aspects of the invention will be described in connection with various methods and apparatus for detecting, identifying, and redefining wiring connections in electrical power systems within an industrial automation application. That is because the features and advantages that arise due to embodiments of the invention are well suited to this purpose. For this reason, the methods and apparatus will be described in the context of power monitor embodiments adapted to monitor and/or meter electrical power distribution systems. Still, it should be appreciated that the various aspects of the invention can be applied to achieve other objectives as well. For example, the methods and apparatus of the present invention may include power monitors adapted to monitor and/or meter other types of power distribution systems, such as water, gas, steam, and air, as non-limiting examples, for the same or similar purposes.

Embodiments of the power monitor described herein provides technical advantages in that they are capable of analyzing the voltage and current input wiring connections to the power monitor, and in turn, reduce or eliminate the electrical power wiring expertise required of the user. The power monitor's ability to provide a virtual correction of wiring errors allows the user to immediately correct the identified problem and avoid any need to wait for a power shut-down. The wiring error can be corrected automatically by simply instructing the power monitor to redefine the input wiring so as to eliminate the wiring error. Virtual wiring correction also provides the benefit of avoiding the need for having an electrician go back into the electrical switchgear to make physical wiring corrections.

The virtual wiring correction capability provides a smoother and quicker installation process for the user. Since this capability can eliminate the need for an electrician to open up the switchgear cabinet after initial installation, it improves safety for the user and can reduce installation costs. Since it allows wiring errors to be corrected immediately without shutting the automation system down, the user can begin using the metering information right away to reduce operating costs or improve facility operation, thus resulting in a faster return on investment. The virtual wiring correction capability provides an improved wiring analysis and correction solution for the user.

Figure 1:
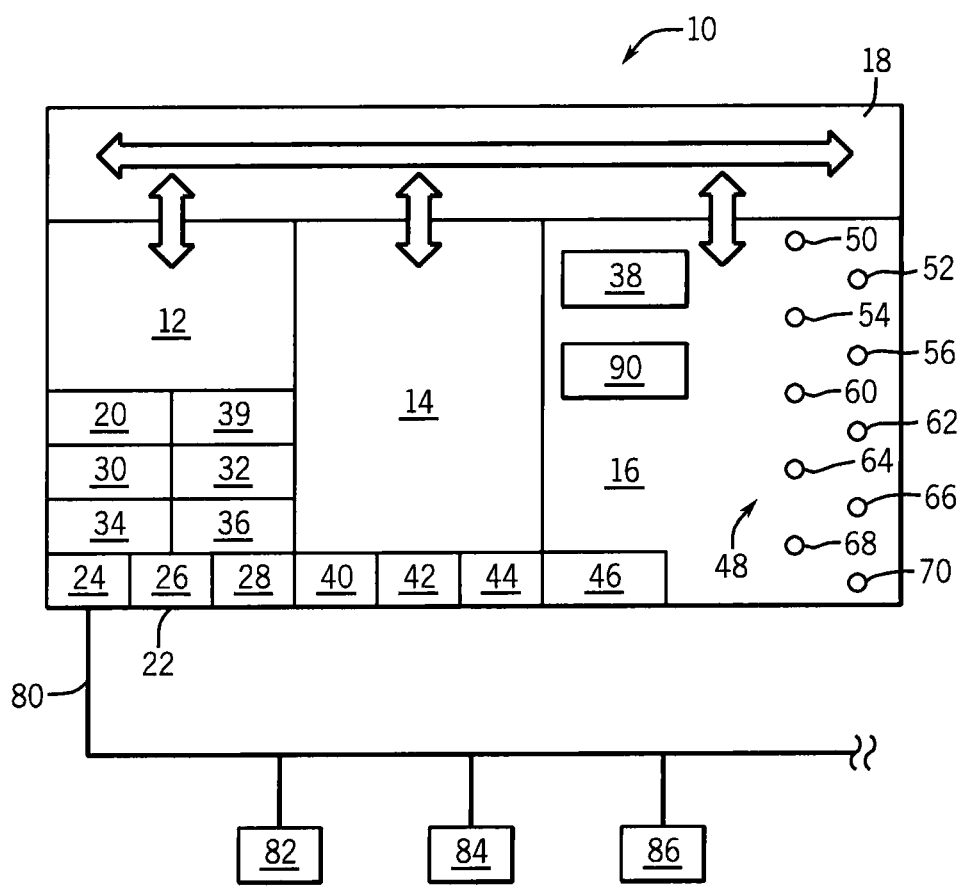
FIG. 1 is a schematic diagram of a power monitor system in accordance with the present embodiments.

Referring to FIG. 1, an exemplary power monitor 10 may comprise a unit that can be described in terms of various assemblies. The power monitor 10 is shown to include a virtual wiring correction assembly 12, a power supply assembly 14, an input wiring assembly 16, and a backplane assembly 18. Each assembly will now described in further detail. It is to be appreciated that the power monitor 10 may or may not comprise modular components and may include alternative configurations as well. For example, one or more of the assemblies may be combined, and/or features described for one assembly may be located in or on a different assembly. It is to be appreciated that the assemblies 12, 14, 16, and 18 may comprise individual components electrically coupled together, or, they may be combined into one common housing to provide an integral device. Processors, firmware, memory, and communications, for example, may be located in or on one or more of the assemblies, and/or elsewhere on a network.

Virtual wring correction assembly 12 may include one or more processors 20, and may be configured to be responsible for top level control of the power monitor 10. Virtual wring correction assembly 12 may also include a communications interface 22 including one or more user accessible communication ports 24, 26, 28 (three are shown, although more or less are contemplated). For example, the communication ports may be configured for a variety of communication protocols, including but not limited to USB, serial, wireless, Bluetooth, EtherNet, DeviceNet, ControlNet, and Ethernet with Device Level Ring (DLR) technology. One or more of the communication ports allows the power monitor 10 to be networked to additional power monitors.

The virtual wiring correction assembly 12 may further include system memory 30 and/or data memory 32, and firmware 39. Optionally, the memory 30, 32 and/or firmware 39 may be located in the input wiring assembly 16, for example. The memory 30, 32 may be included to store electrical power system wiring mode data 34 and a system power factor 36. The firmware 39 includes program code adapted to redefine input wring connections, as described below.

The power supply assembly 14 accepts user input voltage in either VAC and/or VDC at VAC input 40 and VDC input 42, and configures the input voltage to a system or output voltage that may then be supplied to the backplane assembly 18 for distribution to the assemblies coupled to the backplane. It is to be appreciated that both input and output voltages may range from low voltage levels to high voltage levels as is well known in the art. It is also to be appreciated that transformers known in the art may also be used with high voltage systems. The power supply assembly 18 may also be configured to include standby power 44, e.g., an uninterruptible power supply, a constant voltage transformer, a standby capacitor, and/or battery, for providing power to the power monitor 10 when user input voltage is temporarily not available.

The input wiring assembly 16 may include one or more processors 46, and may be configured as an input wiring interface 48 for the electrical power system wiring. For example, the input wiring interface 48 may include voltage input wiring connections 50, 52, 54, and 56, and current input wiring connections 60, 62, 64, 66, 68, and 70. The voltage and current input wiring connections may be for example finger-safe screw terminals with pressure relief plates, or other known wiring connections. The input wiring assembly 16 may also include additional inputs and outputs (not shown), such as status inputs and outputs for access by the user.

Figure 2:
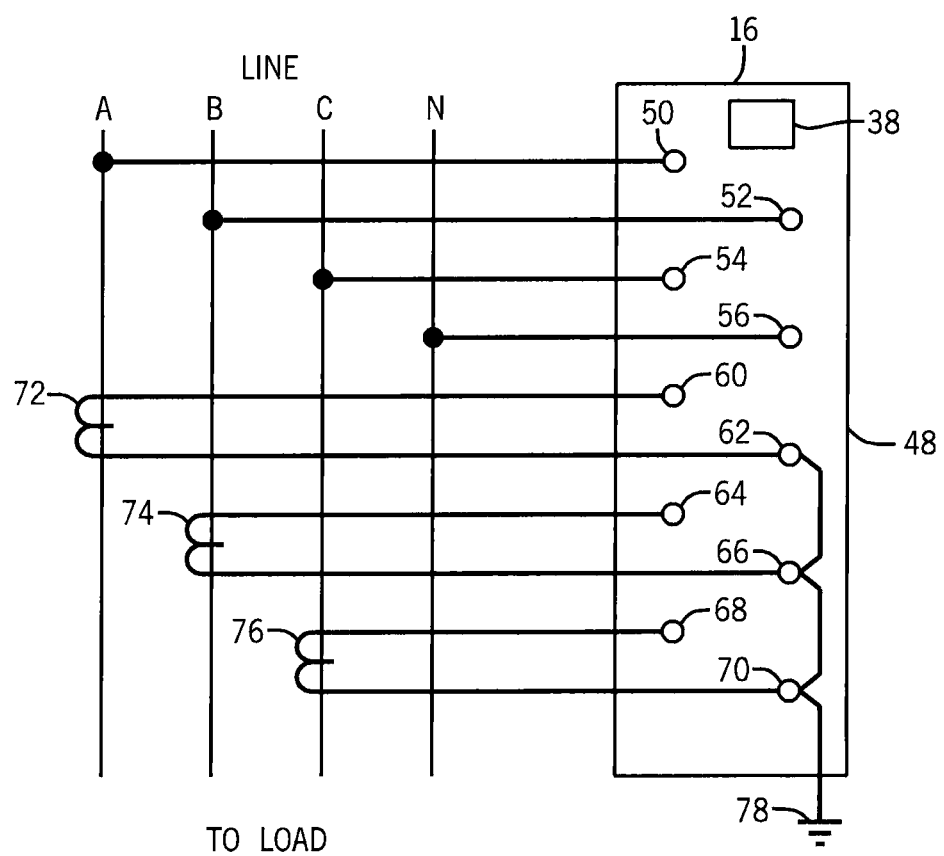
FIG. 2 is a wiring diagram of an electrical power system wiring coupled to a power monitor as shown in FIG. 1.

FIG. 2 illustrates a wiring diagram showing typical voltage connections and current sensing connections to a common three phase, four wire electrical power wiring system configuration. The voltage connections and current sensing connections are shown coupled to the input wiring interface 48 of the input wiring assembly 16. As seen, the voltage input wiring connections 50, 52, 54, and 56 are coupled to LINE A, B, C, and Neutral, respectively. Current input wiring connections 60, 64, and 68 are shown coupled to the positive terminal of current transformer 72, 74, and 76 respectively. Current input wiring connections 62, 66, and 70 are shown coupled to the negative terminal of the current transform 72, 74, and 76 respectively, and jumpered together and coupled to ground 78.

The input wiring assembly 16 may also include an indicator 38, such as one or more LEDs, or a display, such as an LED or LCD screen. The indicator 38 may be used to provide an indication to the user that the virtual wiring correction feature has been enabled. Without the use of an indicator, the user may be unaware that input wiring has been redefined, which may lead to further problems. It is to be appreciated that the indicator 38 may provide an audio indication and/or a visual indication, including but not limited to an illumination including different colors and/or blink rates. The indicator 38 may also be used to provide wiring status results to the user. Alternatively, the wiring status results may be displayed on a laptop or other device coupled to the network, as described below.

Figure 3:
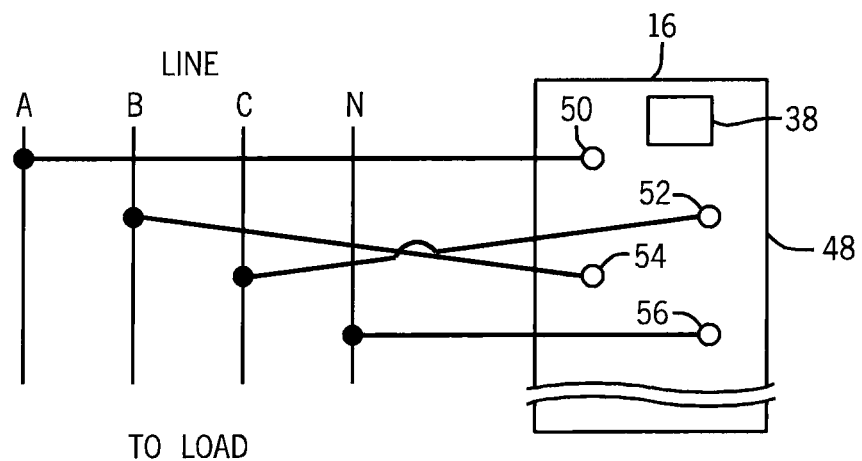
FIG. 3 is a wiring diagram of an electrical power system wiring coupled to a power monitor as shown in FIG. 1, and showing a wiring error.
Figure 4:
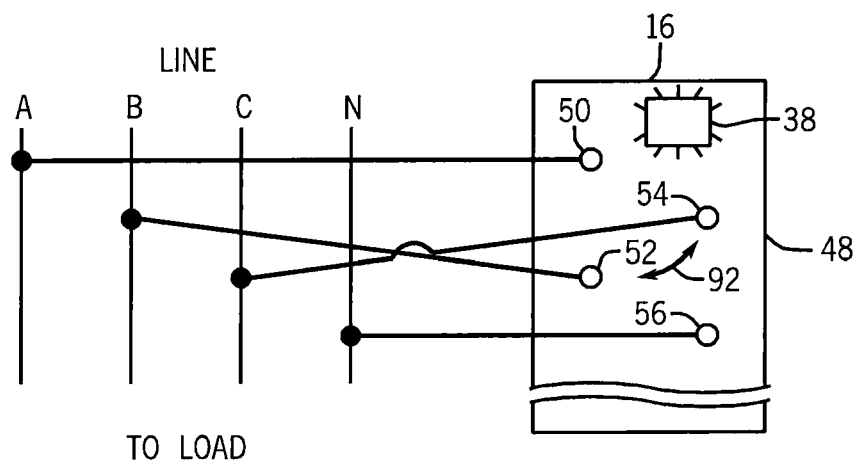
FIG. 4 is a wiring diagram of an electrical power system wiring coupled to a power monitor as shown in FIG. 1, and showing the wiring error of FIG. 3 redefined and an indicator illuminated.

FIGS. 3 and 4 are similar to FIG. 2 in that they show wiring diagrams showing typical voltage connections to a common three phase, four wire electrical power wiring system configuration. The voltage connections in FIG. 3 have been shown to include a wiring error. As seen, the wires coupling phase B and phase C to the input wiring interface 48 have been inadvertently reversed. Phase B should be wired to input wiring connection 52 and phase C should be wired to input wiring connection 54.

FIG. 4 shows the same wiring configuration as shown in FIG. 3, except after a virtual wiring correction has been performed. As seen, the wires coupling phase B and phase C to the input wiring interface 48 have not been physically corrected. Instead, the input wiring connections 52 and 54 have been redefined by the firmware 39 of the power monitor 10, as indicated by arrow 92. In addition, the indicator 38 is shown illuminated to indicate to the user that a virtual wiring correction is active and that input wiring has been redefined.

The power monitor 10 is adapted to analyze both voltage and current input wiring to the power monitor, and then to identify to the user any existing wiring errors in the electrical power system wiring configuration. The virtual wiring correction assembly 12 allows the power monitor 10 to provide a "virtual" correction of the identified wiring error(s), meaning the correction is made within the power monitor firmware 39 by redefining the input wiring, and not to the physical wiring of the electrical power system.

Contemplated electrical power system wiring configurations supported by the input wiring assembly include all configurations of single, two, and three phase systems, as non-limiting examples. For example, the input wiring interface 48 allows for a direct connection to both standard and non-standard three-phase wiring topologies. As non-limiting examples, topologies that may be supported include 3 wire wye and 4 wire wye (both grounded or ungrounded neutral), delta/open delta, corner grounded delta, high leg delta, and impedance grounded wye.

The backplane assembly 18 may be configured as a local Ethernet backplane, although other configurations are contemplated, such as a proprietary configuration. Each assembly coupled to the backplane assembly 18 is adapted to draw power, e.g., a system voltage, from the backplane assembly and communicate with other assemblies across the backplane assembly 18. In addition, the backplane assembly 18 may be configured to provide electrical isolation between assemblies coupled to the backplane assembly.

As seen in FIG. 1, the previously described communication interface 22 provides access to a network 80. Additional devices such as a laptop 82, a display 84, and/or a Human Machine Interface (HMI) 86, as non-limiting examples, may also reside on the network 80 and may communicate directly or indirectly with one or more of the power monitors or other devices on the network. The additional devices allow a user to access the power monitor 10 for configuration and wiring diagnostics, as discussed below.

In addition, a web interface (an Internet browser) may be used to input and/or view data and change configuration settings on the power monitor 10. The laptop 82 (or similar computer system) having network access to the power monitor 10, may be used to open an Internet browser and enter the power monitor's unit IP address. After a navigation menu appears, the user can navigate to a screen or screens to access setup menus, to generate and view a phasor diagram, to initiate a "Perform Wiring Diagnostics" command, to view wiring status results, and to initiate a "Perform Virtual Wiring Correction" command.

The power monitor 10 may be adapted to perform these wiring diagnostics on demand to detect and report wiring errors. When the Perform Wiring Diagnostics command is given, the power monitor analyses the voltage and current input wiring and returns the wiring status results. To reduce the likelihood of erroneous or misleading wiring diagnostic results, interim results of multiple tests may be compared for agreement before results are displayed.

Exemplary wiring status results may include:

| | |
|---|---|
| Pass | System wiring is correct for the voltage mode and power factor selections. |
| Failed | System wiring is incorrect. Refer to voltage and current input status for additional information. |
| Input Low | Measured current is below 10% of full scale. |
| Disabled | The power monitor is disabled. |
| Waiting Command | Five minutes have elapsed since the most recent command. |
| Out of Range | Measured phase angles are outside the range of the selected system power factor. |

Exemplary voltage and current input status results may include:

| | |
|---|---|
| Voltage or current input missing (input below the metering threshold) or inverted (reverse polarity, 180 degrees out of phase) | |
| −1 | Test not run; see wiring status for reason. |
| 0 | Pass, all inputs present/correct polarity. |
| 1 | Phase 1 missing/inverted. |
| 2 | Phase 2 missing/inverted. |
| 3 | Phase 3 missing/inverted. |
| 12 | Phase 1 and 2 missing/inverted. |
| 13 | Phase 1 and 3 missing/inverted. |
| 23 | Phase 2 and 3 missing/inverted. |
| 123 | All 3 phases missing/inverted. |

Exemplary voltage rotation status results may include:

| | |
|---|---|
| −1 | Test not run; see wiring status for reason. |
| 123 | Forward phase rotation (ABC). |
| 132 | Reverse phase rotation (ACB). |
| 4 | Invalid phase rotation (2 inputs wired with same phase). |

Exemplary current rotation (referenced to voltage Phase 1) status results may include:

| | |
|---|---|
| −1 | Test not run; see wiring status for reason. |
| 123 | Forward rotation (ABC). |
| 231 | Forward rotation, 120 degrees displaced (BCA). |
| 312 | Forward rotation, 240 degrees displaced (CAB). |
| 132 | Reverse rotation (ACB). |
| 213 | Reverse rotation, 120 degrees displaced (BAC). |
| 321 | Reverse rotation, 240 degrees displaced (CBA). |
| 4 | Invalid phase rotation (2 inputs wired with same phase). |

Figure 5:
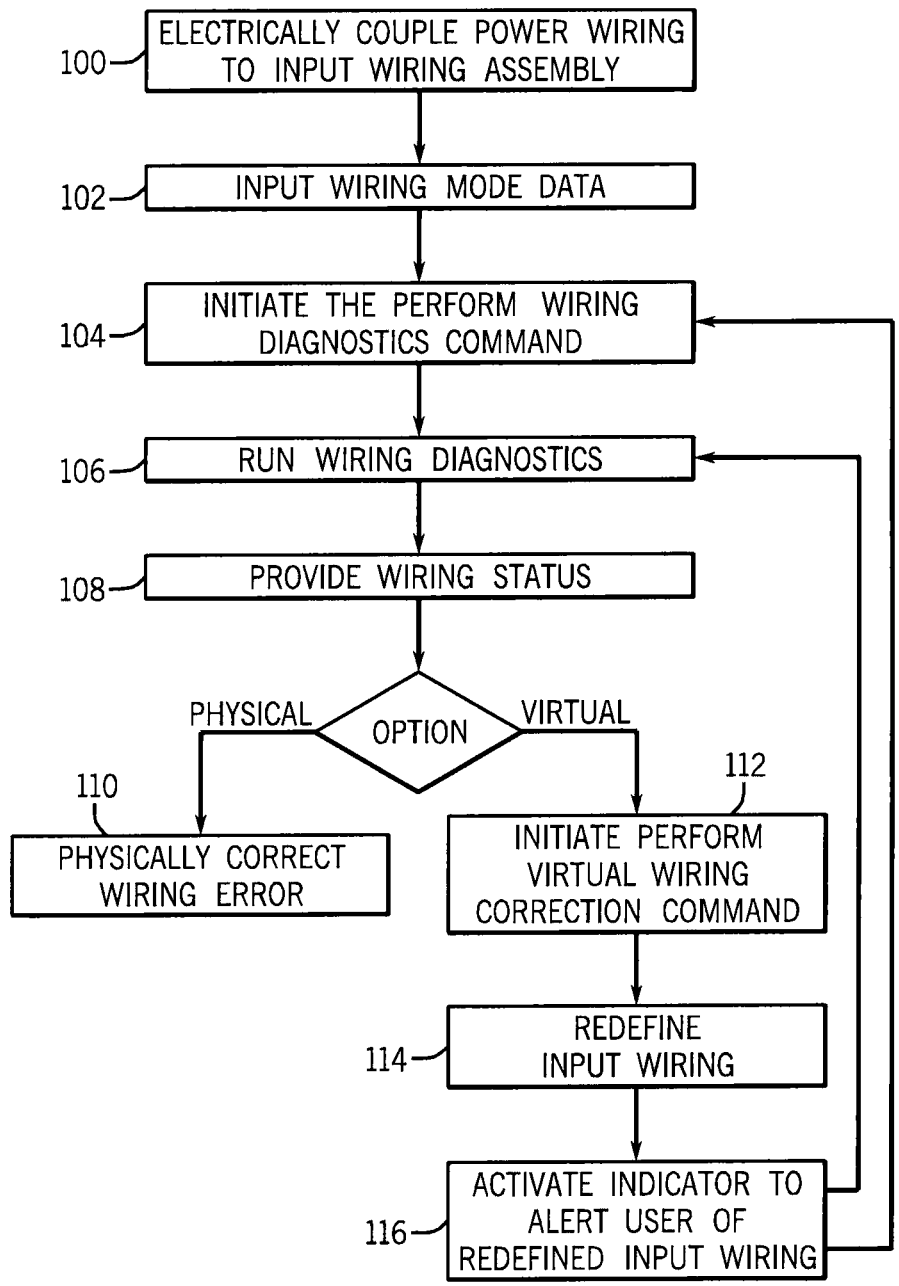
FIG. 5 is a flow chart showing exemplary steps that may be carried out in accordance with the present embodiments.

The steps performed while practicing an exemplary embodiment of the invention consistent with the embodiments described above are set forth in FIG. 5. Referring particularly to FIG. 5, one step is to electrically couple the electrical power wiring system configuration (for example, as shown in FIG. 2) to the input wiring assembly 16, as indicated at process block 100.

At process block 102, the user inputs wiring mode data 34. The wiring mode data may include electrical power system wiring configuration data such as power system wiring phase, such as single phase or three phase; alternating current (AC) or direct current (DC); and the load wiring configuration, such as wye or delta, or variations thereof. Optionally, the user may also input the electrical power system power factor data. As previously described, the wiring mode data and power factor data may be entered using an interface, such as laptop 82 coupled to the network 80, or the laptop may be coupled to a communication port 24.

Next, at process block 104, the user instructs the power monitor 10 to run the wiring diagnostics by initiating the Perform Wiring Diagnostics command. The wiring diagnostics command may be initiated using the laptop 82, as previously discussed, or the user could initiate the wiring diagnostics command via optional input controls 90 on the power monitor 10, as shown on the input wiring assembly 16.

Next, at process block 106, the power monitor 10 runs the wiring diagnostics, and at process block 108, provides a wiring status (as described above). The wiring status provides an indication that a wiring error has been detected, or, that there are no detected wiring errors. The wiring status may be provided by the indicator 38.

When the wiring status indicates a wiring error has been detected, the user has the option (indicated at decision block 109) of either physically correcting the wiring error(s) as indicated at process block 110, or, the user is able to initiate the Perform Virtual Wiring Correction command, as indicated at process block 112. As such, the ability to perform virtual wiring corrections allows wiring errors to be virtually corrected in which the firmware 39 redefines the input wiring internal to the power monitor 10 without the need to shut down the power distribution system, and without incurring any associated delays for shutting down the power distribution system and making the physical corrections, as indicated at process block 114. If the user decides to instruct the power monitor 10 to perform the virtual wiring correction, the indicator 38 is activated for the user when the virtual wiring correction has been enabled to alert the user and others to the fact that the power monitor has redefined one or more of the voltage or current input wiring connections, as indicated at process block 116. If the wiring status provides an indication that no wiring errors have been detected, the wiring diagnostics is complete.

After the user instructs the power monitor 10 to perform the virtual wiring correction (as indicated at process block 112), or after the user has physically corrected an indicated wiring error (as indicated at process block 110), the wiring diagnostics may be complete. Optionally, the user may instruct the monitor to re-run the wiring diagnostics, as indicated at process block 104, or, the power monitor 10 may automatically re-run the wiring diagnostics, as indicated at process block 106. If instructed by the user, or if initiated automatically, in either case, the monitor would re-run the wiring diagnostics and again provide a wiring status, as indicated at process block 108.

When the wiring status provides an indication that a wiring error has been detected, the user is able to physically correct the wiring error as indicated by the wiring status, or, the user is able to instruct the monitor to perform a virtual wiring correction, in which the firmware corrects the wiring error internal to the power monitor. If the user decides to instruct the power monitor 10 to perform a virtual wiring correction, the indicator 38 is activated to inform the user that a virtual wiring correction is active. If the wiring status provides an indication that no wiring errors have been detected, the wiring diagnostics is complete.

The electrical power system wiring analysis and virtual wiring correction process can be an iterative process, and may take multiple iterations to completely correct the wiring errors. The process can also be manual or automated, meaning that the power monitor can automatically re-diagnose after wiring correction (virtual or physical) has been made, or the power monitor 10 may require user initiation to re-diagnose. After the first diagnostic check and wiring correction, a recheck may identify a problem that was not identifiable with the first diagnostic check.

Therefore, methods and apparatus to automatically detect wiring error(s), identify to the user what wiring error has been detected, and redefine the wiring configuration, so that the power monitor can provide accurate metering data is provided. The methods and apparatus desirably provide an indication to the user that the power monitor has redefined the electrical power system wiring.

This written description uses examples to disclose the invention, including the best mode, and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Finally, it is expressly contemplated that any of the processes or steps described herein may be combined, eliminated, or reordered. In other embodiments, instructions may reside in computer readable medium wherein those instructions are executed by a processor to perform one or more of processes or steps described herein. As such, it is expressly contemplated that any of the processes or steps described herein can be implemented as hardware, software, including program instructions executing on a computer, or a combination of hardware and software. Accordingly, this description is meant to be taken only by way of example, and not to otherwise limit the scope of this invention.

We claim:

1. An energy measurement, control and management system for monitoring and redefining an electrical power system wiring configuration within an industrial automation application, the system comprising:
   an input wiring assembly including voltage and current input wiring connections to be electrically coupled to the electrical power system wiring configuration, the input wiring assembly to receive voltage and current input wiring data from the electrical power system wiring configuration coupled to the voltage and current input wiring connections, the voltage and current input wiring data associated with the electrical power system wiring configuration within the industrial automation application;
   a virtual wiring correction assembly in communication with the input wiring assembly, the virtual wiring correction assembly to receive the voltage and current input wiring data and determine if there is duplicated voltage or current input wiring data and if both the voltage and current input wiring data in an input pair are inverted and if the voltage or current input wiring data is missing and if the electrical power system wiring configuration matches a preconfigured electrical power system wiring configuration; and
   an indicator to provide an indication that, when the virtual wiring correction assembly determines that there is duplicated voltage or current input wiring data or if both the voltage and current input wiring data in an input pair are inverted or if the voltage or current input wiring data is missing or if the electrical power system wiring configuration does not match the preconfigured electrical power system wiring configuration, the virtual wiring correction assembly has redefined one or more of the voltage and current input wiring connections so the electrical power system wiring configuration matches the preconfigured electrical power system wiring configuration.

2. The system according to claim 1:
   wherein the virtual wiring correction assembly redefines one or more of the voltage and current input wiring connections.

3. The system according to claim 1:
   wherein the electrical power system wiring configuration comprises at least one of a single-phase system and a three-phase system.

4. The system according to claim 1:
   wherein the electrical power system wiring configuration comprises at least one of a 4 wire wye with grounded neutral, 4 wire wye with ungrounded neutral, 3 wire wye, impedance grounded wye, delta, open delta, corner grounded delta, and high leg delta.

5. The system according to claim 1:
   wherein the indicator further provides a wiring status indication, the wiring status indication to indicate that no wiring error was detected, or an indication of a specific wiring error.

6. The system according to claim 5:
   wherein the specific wiring error includes at least one of inverted voltage inputs, inverted current inputs, improper phase sequence of the voltage inputs, improper phase sequence of the current inputs, and incorrect correlation of the voltage and current phases.

7. The system according to claim 1:
   wherein the indicator is at least one of an LED and a display.

8. A system for monitoring and redefining an electrical power system wiring configuration, the system comprising:
   an input wiring assembly including voltage input wiring connections and current input wiring connections to be electrically coupled to the electrical power system wiring, the input wiring assembly to receive voltage input wiring data and current input wiring data from the electrical power system wiring configuration;
   a virtual wiring correction assembly in communication with the input wiring assembly, the virtual wiring correction assembly to receive the voltage input wiring data and the current input wiring data and diagnose if there is duplicated voltage or current input wiring data and if both the voltage and current input wiring data in an input pair are inverted and if the voltage or current input wiring data is missing and if the electrical power system wiring configuration matches a preconfigured electrical power system wiring configuration; and
   an indicator to provide an indication that, when the virtual wiring correction assembly determines that there is duplicated voltage or current input wiring data or if both the voltage and current input wiring data in an input pair are inverted or if the voltage or current input wiring data is missing or if the electrical power system wiring configuration does not match the preconfigured electrical power system wiring configuration, the virtual wiring correction assembly has redefined in firmware one or more of the voltage input wiring connections and current input wiring connections so the electrical power system wiring configuration matches the preconfigured electrical power system wiring configuration.

9. The system according to claim 8:
   wherein the input wiring assembly and the virtual wiring correction assembly are coupled to a backplane assembly, the backplane assembly to pass communication signals between the input wiring assembly and the virtual wiring correction assembly.

10. The system according to claim 9:
    further including a power supply, the power supply coupled to the backplane and accepts user input voltage, and configures the input voltage to a system voltage, the backplane assembly to pass the system voltage to the input wiring assembly and the virtual wiring correction assembly.

11. The system according to claim 8:
    wherein the preconfigured electrical power system wiring configuration includes electrical power system wiring configuration data including an electrical power system wiring phase and a load wiring configuration.

12. The system according to claim 11:
wherein the preconfigured electrical power system wiring configuration further includes an electrical power system power factor data.

13. The system according to claim 8:
wherein the virtual wiring correction assembly re-diagnoses if the electrical power system wiring configuration matches the preconfigured electrical power system wiring configuration after the virtual wiring correction assembly has redefined one or more of the voltage input wiring connections and current input wiring connections.

\* \* \* \* \*